United States Patent [19]

Matsuda et al.

[11] Patent Number: 4,887,136

[45] Date of Patent: Dec. 12, 1989

[54] SEMICONDUCTOR MEMORY DEVICE AND THE METHOD FOR MANUFACTURING THE SAME

[75] Inventors: Yoshio Matsuda; Kazuyasu Fujishima, both of Hyogo, Japan

[73] Assignee: Mitsubishi Denki Kabushiki Kaisha, Tokyo, Japan

[21] Appl. No.: 110,462

[22] Filed: Oct. 20, 1987

[30] Foreign Application Priority Data

Oct. 20, 1986 [JP] Japan .................. 61-250162

[51] Int. Cl.$^4$ ............... H01L 29/78; H01L 29/06; H01L 27/02
[52] U.S. Cl. ............................ 357/23.6; 357/55; 357/41
[58] Field of Search ........................ 357/23.6

[56] References Cited

FOREIGN PATENT DOCUMENTS

| 12739 | 3/1983 | Japan . | |
|---|---|---|---|
| 117258 | 7/1984 | Japan | 357/23.6 |
| 056442 | 3/1986 | Japan | 357/23.6 |
| 58266 | 3/1986 | Japan | 357/23.6 |
| 136256 | 6/1986 | Japan | 357/23.6 |
| 187263 | 8/1986 | Japan . | |

OTHER PUBLICATIONS

"Subthreshold Conduction in MOSFET's", Geoffrey W. Taylor, IEEE Transactions on Electron Devices, vol. ED-26, No. 3, Mar. 1978.

Primary Examiner—Rolf Hille
Assistant Examiner—Robert P. Limanek
Attorney, Agent, or Firm—Lowe, Price, LeBlanc, Becker & Shur

[57] ABSTRACT

A dynamic semiconductor memory device comprising a substrate having one trench including two capacitors for memory cell capacitances of two bits, and two elements such as transistors for reading, writing, and storing information represented by charge, arranged symmetrically at the central portion of the trench so as to correspond to the memory cells for two bits, and a field oxide film formed at the center of the trench on the bottom and on the side walls for separating the capacitors and elements.

11 Claims, 6 Drawing Sheets

SEMICONDUCTOR MEMORY DEVICE AND THE METHOD FOR MANUFACTURING THE SAME

BACKGROUND OF THE INVENTION

1. Field of the Invention

The present invention relates to a dynamic semiconductor memory device and more specifically it relates to a semiconductor memory device which is suitable for high integration.

2. Description of the Prior Art

A dynamic semiconductor memory device has been widely known. FIG. 1 is a block diagram showing the whole structure of a conventional dynamic semiconductor memory device.

Referring to FIG. 1, the dynamic semiconductor memory device comprises an array including a plurality of memory cells constituting a memory portion, a X decoder and a Y decoder for selecting the address thereof and an input/output interface portion including a sense amplifier connected to an input/output buffer. The plurality of memory cells constituting the memory portion are connected to each of intersections of the word lines connected to the X decoder and the bit lines connected to the Y decoder structured in a matrix, thereby forming the said array.

The operation will be hereinafter described. In response to an externally applied row address signal and column address signal, that memory cell is selected which is at the intersection of one word line and one bit line, each of which is selected by the X decoder and the Y decoder and the information is read out or written into the memory cell through the input/output buffer and the input/output interface portion including the sense amplifier.

Generally, as a semiconductor memory device especially a dynamic semiconductor memory device comes to be more highly integrated, the area occupied by the memory cells, constituting the information storing portion, tends to be smaller. In order to secure as much capacitance as possible in a limited area, various types of memory cells have been proposed. For example, FIG. 2A shows a plan view of a conventional semiconductor memory device in which a fine aperture, which may be referred to as a trench region, is formed in a semiconductor substrate and the side wall thereof is used as a capacitor portion to provide sufficient capacitance (for example, Patent Publication Gazette No. 12739/1983). FIG. 2B is a cross sectional view taken along the line IIB—IIB of FIG. 2A.

FIG. 3A is a plan view showing a semiconductor memory device arranged to be suited for a folded bit line structure, FIG. 3B is a cross sectional view taken along the line IIIB—IIIB of FIG. 3A and FIGS. 4A to 4C are cross sectional views showing the manufacturing method of the semiconductor memory device.

Referring to the figures, trench regions 10 and 11 which are used to form capacitors for storing information-representing charge are formed on the main surface of a p+ substrate 1 each in a trench form and to be juxtaposed each other. A capacitor region is formed by an impurity doped layer 6a and a cell plate 4 with a capacitor insulating film 5 interposed therebetween. Tee two juxtaposed trench regions 10 and 11 are separated by a separating region 2, and below the separating region 2 an inversion preventing layer 3 is formed for preventing inversion. Drain and source regions 6b of transistors are formed by the sides of the trench regions 10 and 11 opposite to the separation region. Above a channel region which is between the source and drain regions 6b, word lines 8a to 8d are formed through a gate insulating film 12. These word lines 8a to 8d and the capacitor electrode 4 are covered with an oxide film 12 and the bit lines formed on the oxide film 12 are connected to the source regions 6b of the transistors through a contact hole 13. Meanwhile, in the plan views such as FIGS. 2A and 3A, the Al bit lines 7 are omitted.

In such semiconductor memory device as described above, a trench region is formed in a semiconductor substrate and the sides and the bottom thereof are used as a portion for storing electric charge representing information in order to substantially increase the area.

The method for manufacturing the above described conventional semiconductor memory device will be described with reference to FIGS. 4A to 4C. First, boron is ion implanted into that portion which is to be an element-separating region, so that a p+ type channel stop region 3 for separating elements is formed, and then a field oxide film 2 is formed (FIG. 4A). Then trench regions 10 and 11 are formed and by arsenic ion implantation, for example, a n+ type diffusion region 6a which is to be a charge storing region is formed (FIG. 4B). Next, a first polysilicon layer 4 which is to be a cell plate is formed and a silicon oxide film 12 is deposited thereon by, for example, a chemical vapor deposition (CVD) method and word lines 8a to 8d are formed by a second layer of polycrystalline silicon (FIG. 4C). Subsequently, a n+ diffusion layer 6b is formed and an insulating layer of for example phosphosilicate glass is formed. Thereafter a contact hole 9 is formed and an Al wire 7 is provided to obtain the conventional semiconductor memory device shown in FIGS. 3A and 3B.

The conventional semiconductor memory device is structured as described above. In order to realize higher integration, the space between the trenches 10 and 11 must be made narrower. In that case, the depletion layers generated on the opposing sides of the two juxtaposed trench regions 10 and 11 are connected to each other, causing a punch through which may damage the stored information. Detail information as to the short channel effect which causes the punch through is shown in, for example, "Subthreshold Conduction in MOSFET's", Geoffrey W. Taylor IEEE Transactions on Electron Devices, Vol. ED-26, No. 3, March, 1978. Therefore, the conventional device can not always cope with the high integration.

Meanwhile, memory cells having two capacitors provided opposed to each other in a trench are disclosed in Japanese Patent Laying-Open Gazette No. 136256/1986 and in Japanese Patent Laying-Open Gazette No. 187263/1986. However, in the first mentioned prior art, the capacitance is not sufficient since the capacitor regions are formed only in the opposing areas, and in the second mentioned prior art, the manufacturing process is complicated.

SUMMARY OF THE INVENTION

Therefore, a main object of the present invention is to provide a semiconductor memory device and a method for making the same which prevents the damage of storing information due to the punch through and which is suitable for high integration.

The above object of the present invention is accomplished by providing one trench region for two memory cells, in contrast of the conventional memory cell structure in which one trench region is provided for one memory cell.

Briefly stated, the present invention provides a dynamic semiconductor memory device structured such that one trench is formed for two memory cells by forming an element-separating region over the central bottom, so that the side portions of the trench separately form portions for storing charge representing 2 bits, thereby eliminating the opposing side walls of conventional two juxtaposed trenches.

According to a semiconductor memory device of the present invention, since the opposing side walls of two juxtaposed trench regions are eliminated, the damage of information due to the punch through can be depressed to the same level as in the case of a semiconductor memory device having a flat capacitor.

According to a preferred embodiment, one trench region having memory capacitance of 2 bits is formed on the semiconductor substrate, so that a pair of memory cells including a pair of transistors and a pair of capacitors for two memory cells for carrying out reading/writing and storing information represented by charge is formed symmetrically in relation to the center of the trench so that paired memory cells are separated at the central portion on the bottom and the side walls of the trench to form a semiconductor memory device.

By forming the semiconductor memory device as described above, a highly integrated semiconductor memory device can be provided which depresses the degree of damage of information to the conventional level.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
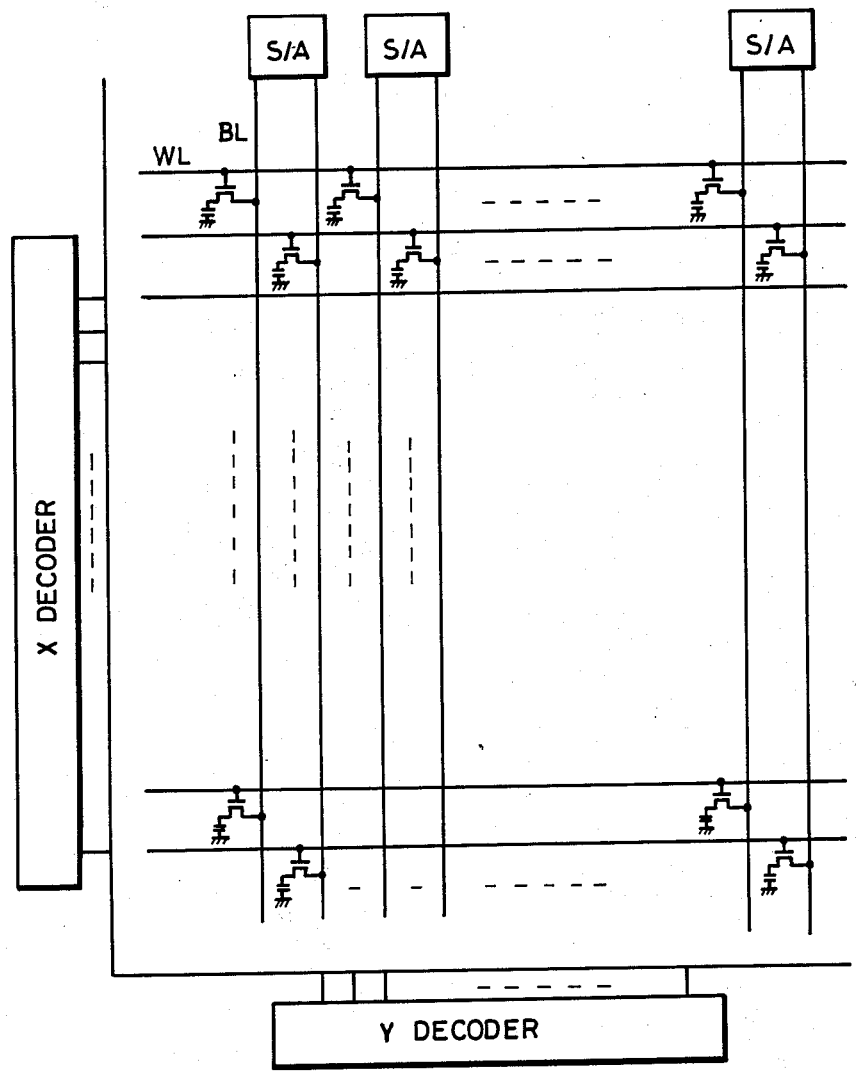
FIG. 1 is a block diagram showing the whole structure of a dynamic semiconductor memory device.
Figure 2A:
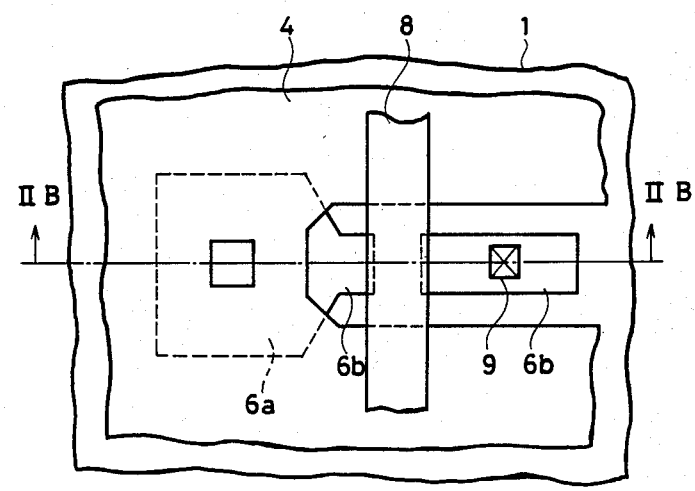
FIGS. 2A and 2B are a plan view and a cross sectional view, respectively, of a conventional semiconductor device having a trench.
Figure 2B:
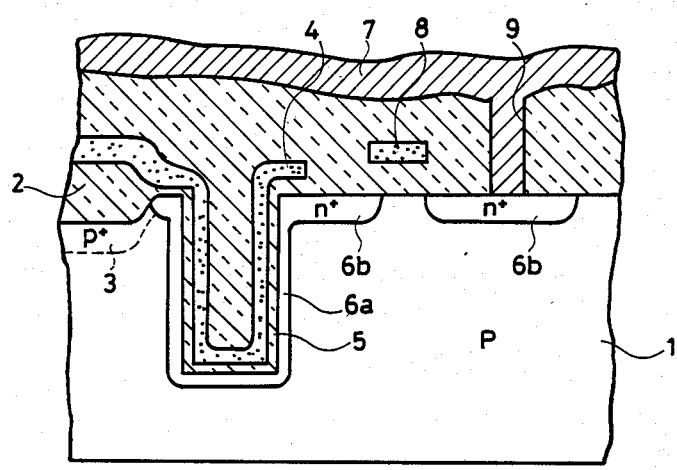
Figure 3A:
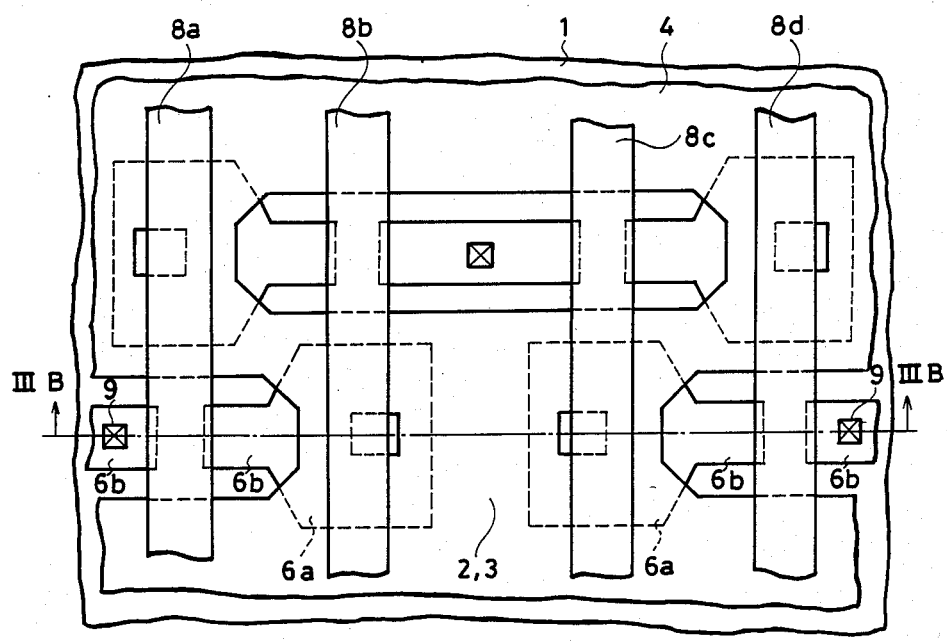
FIGS. 3A and 3B are a plan view and a cross sectional view, respectively, of a semiconductor memory device having a trench region in which it is arranged to be suited for a folded bit line structure.
Figure 3B:
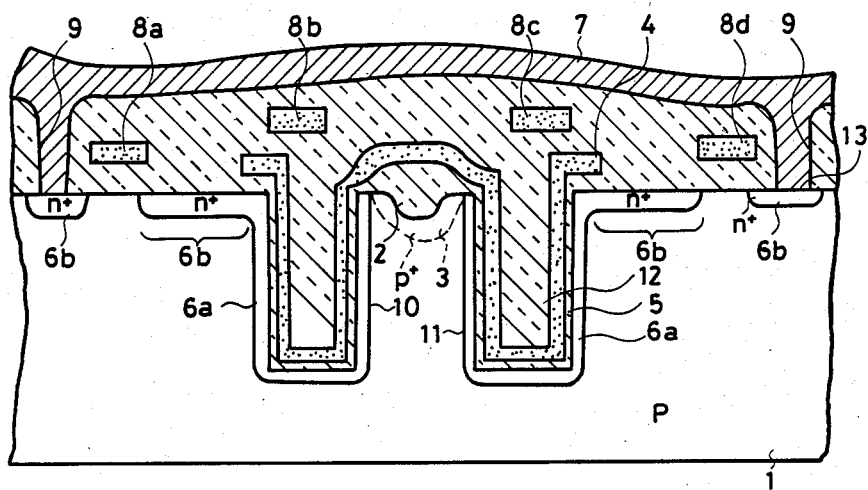
Figure 4A:
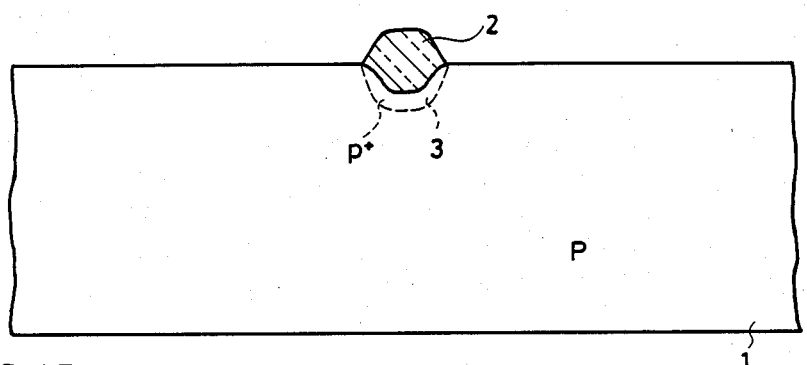
FIGS. 4A to 4C are cross sectional views showing a manufacturing process of a conventional semiconductor memory device having trench regions.
Figure 4B:
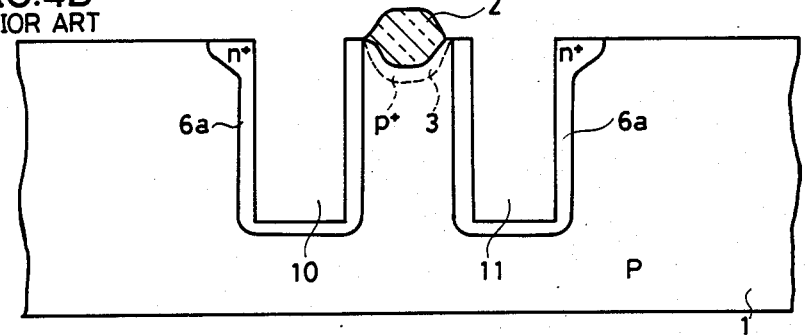
Figure 4C:
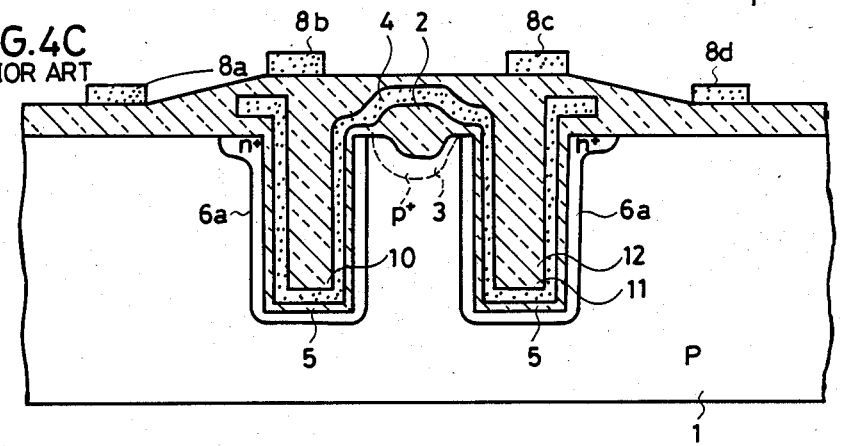
Figure 5A:
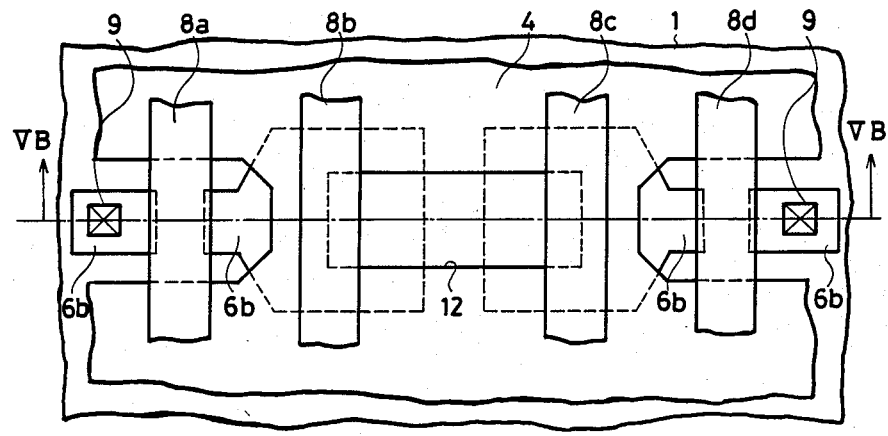
FIGS. 5A and 5B are a schematical plan view and a cross sectional view of a semiconductor memory device according to one embodiment of the present invention.
Figure 5B:
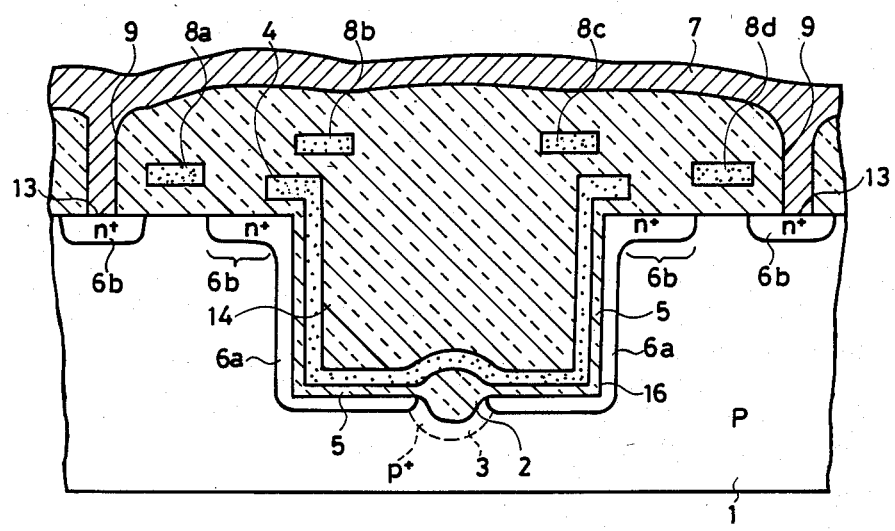
Figure 6A:
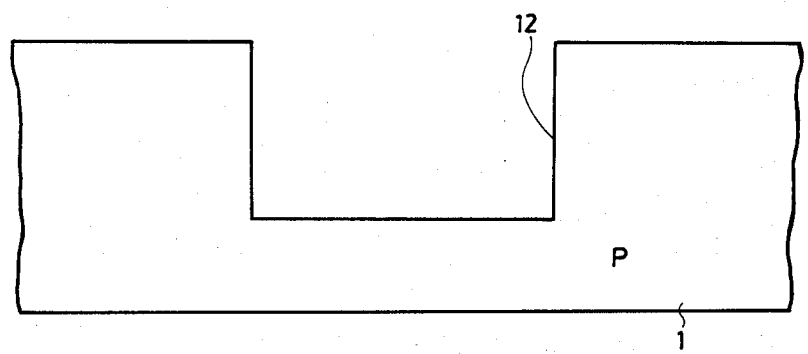
FIGS. 6A to 6C are cross sectional views showing the manufacturing process of the semiconductor memory device according to one embodiment of the present invention.
Figure 6B:
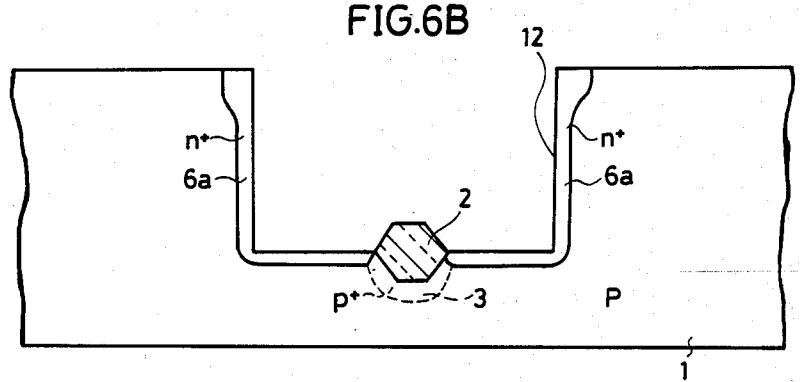
Figure 6C:
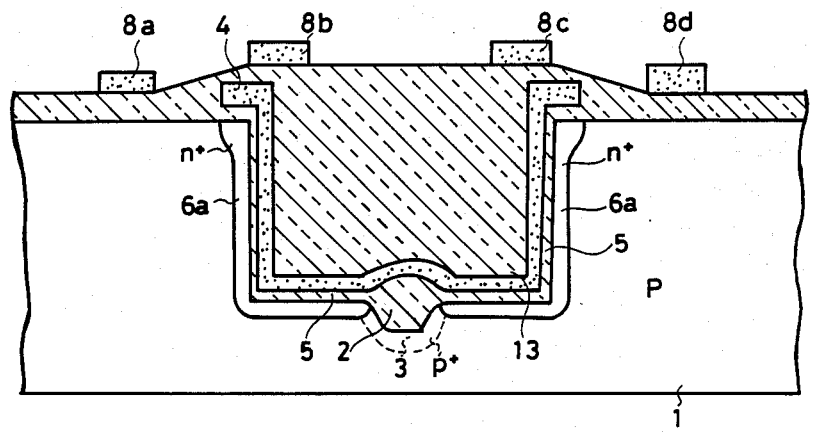

FIG. 5A shows a schematic plan view of a dynamic semiconductor memory device according to one embodiment of the present invention. FIG. 5B is a cross sectional view taken along the line VB—VB of FIG. 5A. These figures correspond to FIGS. 3A and 3B, respectively, of the conventional semiconductor memory device. FIGS. 6A to 6C are cross sectional views showing the manufacturing process of the semiconductor memory device according to the present embodiment, corresponding to FIGS. 4A to 4C. Referring to FIGS. 5A and 5B, the reference numeral 14 denotes one trench region having capacitance for two bits according to the present invention, which were constituted by two trenches 10 and 11 in the conventional semiconductor memory device.

As described above, according to the present invention, the memory cell regions for 2 bits constituted by two trench regions 10 and 11 in the conventional semiconductor memory device come to be structured with one trench region 14 and the memory cells for 2 bits are separated at the center of the bottom and the side walls of the trench region 14. Therefore, the areas of the trench each forming one bit are not opposed to each other at the side walls. Therefore, a possibility of punch through becomes the same level as in the case of a semiconductor memory device having a flat capacitor structure.

The manufacturing steps of the semiconductor memory device according to this embodiment will be hereinafter described with reference to FIGS. 6A to 6C. According to the present embodiment, different from a conventional device, first a trench 14 is formed (FIG. 6A). Then, as in the step shown in FIG. 4A, a p+ type channel stop region 3 for separating elements and a field oxide film 2 are formed and a n+ type diffusion layer 6a is formed (FIG. 6B). The steps following FIG. 6C correspond to the steps following FIG. 4C and the device is manufactured in the same manner.

As described above, according to the present invention, the trench region forming a portion for storing charge representing information for two-bits of memory cells is formed in one trench and elements are separated at the center of the trench on the bottom and on the side walls, thereby eliminating the conventional opposing side walls of the juxtaposed trench regions. Therefore a possibility of damage to the information due to punch through is kept the same as in the case of a memory cell having a flat capacitor structure. Therefore, a highly integrated semiconductor device having high reliability can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
   a semiconductor substrate of a certain conductivity type and having a main surface, and a trench formed for providing a capacitance for storing charge representing information;
   an insulating layer formed on the side walls and the bottom surface of said trench, said insulating layer comprising a thick insulating portion for separation formed in the longitudinal direction and only in the center region of the bottom surface of said trench, whereby said bottom surface of the trench is separated into one lateral half and the other lateral half;
   one impurity doped region of an opposite conductivity type formed on the side wall and the bottom surface of one lateral half of said trench and below said insulating layer;

the other impurity doped region of the opposite conductivity type formed on the side wall and on the bottom surface of the other lateral half of said trench and below said insulating layer, said one and the other impurity doped regions are separated by said insulating portion; and a U-shaped conductive layer formed on the side walls and across the bottom surface of said trench through said insulating layer, said one and the other impurity doped regions sharing said U-shaped conductive layer and including portions of said impurity doped regions on the bottom surface of said trench adjacent said thick insulating portion of said insulating layer together forming separate capacitors for storing charge.

2. A semiconductor memory device according to claim 1, further comprising semiconductor elements respectively formed adjacent to the ends of said one and the other impurity doped regions on the main surface of said semiconductor substrate.

3. A semiconductor memory device according to claim 1, wherein each said semiconductor element comprises a field effect device.

4. A semiconductor memory device according to claim 3, wherein said field effect device comprises an insulated gate, one electrode and the other electrode formed below said insulated gate with the spacing therebetween, said spacing between said one electrode and the other electrode forming a channel region.

5. A semiconductor memory device according to claim 4, wherein one of said one electrode and the other electrode is connected to one of said one impurity doped region and the other impurity doped region.

6. A semiconductor memory device according to claim 5, wherein said conductive layer comprises a polysilicon layer.

7. A semiconductor memory device according to claim 6, wherein said insulating layer comprises a field oxide film.

8. A semiconductor memory device according to claim 7, wherein said insulating layer comprises an inversion preventing region for preventing inversion formed below said field oxide film.

9. A semiconductor memory device according to claim 8, wherein said inversion preventing region has the same conductivity type as said semiconductor substrate and the impurity concentration thereof is higher than that of said substrate.

10. A semiconductor memory device according to claim 9, wherein said conductive layer has a surface facing the side walls and the bottom surface of said trench, and wherein an oxide film is deposited on the surface of said trench.

11. A semiconductor memory device according to claim 1, wherein said insulating layer further is formed on the main surface of said substrate and extends within the inner surface of said U-shaped conductive layer in said trench.

* * * * *